US012667025B2

(12) United States Patent
Sanuki et al.

(10) Patent No.: US 12,667,025 B2
(45) Date of Patent: Jun. 23, 2026

(54) SEMICONDUCTOR MEMORY DEVICE

(71) Applicant: KIOXIA CORPORATION, Tokyo (JP)

(72) Inventors: Tomoya Sanuki, Yokkaichi (JP); Hiroshi Maejima, Tokyo (JP); Tetsuaki Utsumi, Yokohama (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 18/669,679

(22) Filed: May 21, 2024

(65) Prior Publication Data

US 2024/0304602 A1 Sep. 12, 2024

Related U.S. Application Data

(63) Continuation of application No. 18/056,508, filed on Nov. 17, 2022, which is a continuation of application (Continued)

(30) Foreign Application Priority Data

Sep. 18, 2019 (JP) ................................. 2019-169371

(51) Int. Cl.
| | |
|---|---|
| *H10W 90/00* | (2026.01) |
| *H10W 46/00* | (2026.01) |
| *H10W 90/20* | (2026.01) |

(52) U.S. Cl.
CPC ............ *H10W 90/00* (2026.01); *H10W 46/00* (2026.01); *H10W 90/20* (2026.01); *H10W 90/284* (2026.01); *H10W 90/792* (2026.01)

(58) Field of Classification Search
CPC ..... H01L 25/0657; H01L 24/08; H01L 25/18; H01L 2224/08145; H01L 2225/06524; H01L 2225/06593; H01L 2225/06596; H01L 2924/1431; H01L 2924/14511; H01L 22/32; H10B 41/27; H10B 43/27;
(Continued)

(56) References Cited

U.S. PATENT DOCUMENTS

| | | |
|---|---|---|
| 4,243,937 A | 1/1981 | Multani et al. |
| 5,903,489 A | 5/1999 | Hayano |

(Continued)

FOREIGN PATENT DOCUMENTS

| | | |
|---|---|---|
| CN | 1190790 A | 8/1998 |
| CN | 103295969 A | 9/2013 |

(Continued)

*Primary Examiner* — Elias Ullah

(74) *Attorney, Agent, or Firm* — Oblon, McClelland, Maier & Neustadt, L.L.P.

(57) ABSTRACT

According to one embodiment, a semiconductor memory device includes a memory cell, a first voltage generator and a second voltage generator. The memory cell is provided above a substrate. The first voltage generator is provided between the substrate and the memory cell. The first voltage generator is configured to generate a first voltage to be supplied to the memory cell. The second voltage generator is provided between the substrate and the memory cell. The second voltage generator is configured to generate the first voltage and have a circuit configuration equivalent to the first voltage generator.

13 Claims, 12 Drawing Sheets

Related U.S. Application Data

No. 16/806,079, filed on Mar. 2, 2020, now Pat. No. 11,508,697.

(58) Field of Classification Search

CPC ........ H10B 43/40; H10B 41/40; H10B 41/41; H10B 41/10; G03F 9/7088

See application file for complete search history.

(56) References Cited

U.S. PATENT DOCUMENTS

| | | | |
|---|---|---|---|
| 9,941,009 | B2 | 4/2018 | Lim et al. |
| 10,002,877 | B2 | 6/2018 | Park et al. |
| 2002/0118018 | A1 | 8/2002 | Hasegawa et al. |
| 2004/0164425 | A1 | 8/2004 | Urakawa |
| 2009/0267128 | A1 | 10/2009 | Maejima |
| 2009/0268522 | A1 | 10/2009 | Maejima |
| 2010/0207195 | A1 | 8/2010 | Fukuzumi et al. |
| 2010/0237320 | A1 | 9/2010 | Nagashima |
| 2011/0284946 | A1 | 11/2011 | Kiyotoshi |
| 2012/0300527 | A1 | 11/2012 | Shim et al. |
| 2013/0056881 | A1 | 3/2013 | Zhang |
| 2014/0322885 | A1 | 10/2014 | Xie et al. |
| 2014/0346516 | A1 | 11/2014 | Lee et al. |
| 2015/0155039 | A1 | 6/2015 | Tran et al. |
| 2016/0005758 | A1* | 1/2016 | Hu ........................ H10B 43/20 257/324 |
| 2016/0079164 | A1 | 3/2016 | Fukuzumi et al. |
| 2018/0026044 | A1 | 1/2018 | Utsumi et al. |
| 2018/0174930 | A1 | 6/2018 | Lin et al. |
| 2018/0226362 | A1 | 8/2018 | Watanabe et al. |
| 2018/0350686 | A1 | 12/2018 | Or-Bach et al. |
| 2019/0057756 | A1 | 2/2019 | Kim et al. |
| 2020/0381316 | A1 | 12/2020 | Lee |

FOREIGN PATENT DOCUMENTS

| | | |
|---|---|---|
| CN | 105548851 A | 5/2016 |
| CN | 105977202 A | 9/2016 |
| TW | 4-302895 A | 10/1992 |
| TW | 201344922 A | 11/2013 |
| TW | 201407842 A | 2/2014 |
| TW | 201507226 A | 2/2015 |
| TW | 201510996 A | 3/2015 |
| TW | 201804599 A | 2/2018 |
| TW | 201840993 A | 11/2018 |
| TW | 201842601 A | 12/2018 |
| WO | WO 2013/148090 A2 | 10/2013 |

* cited by examiner

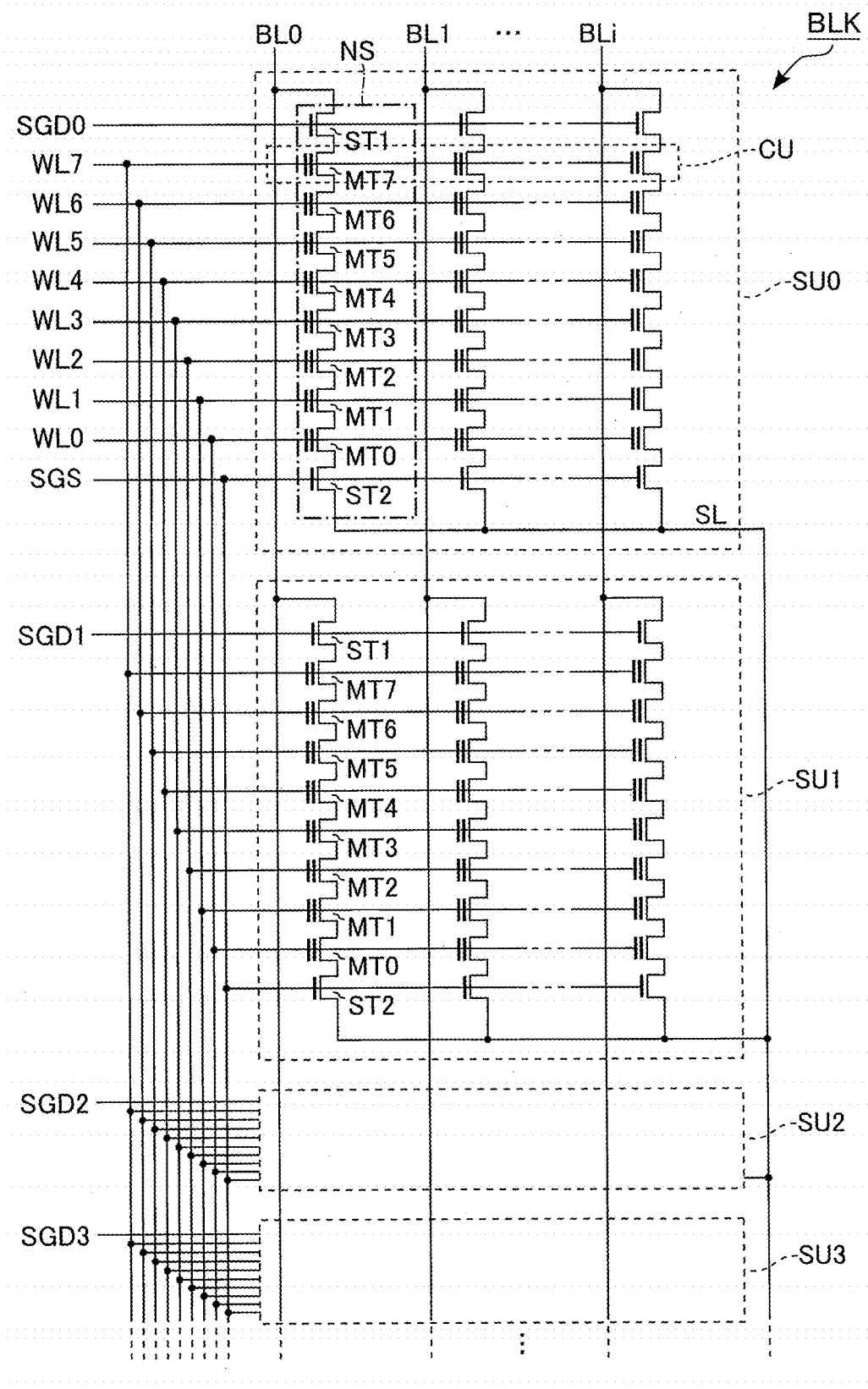
F I G. 4

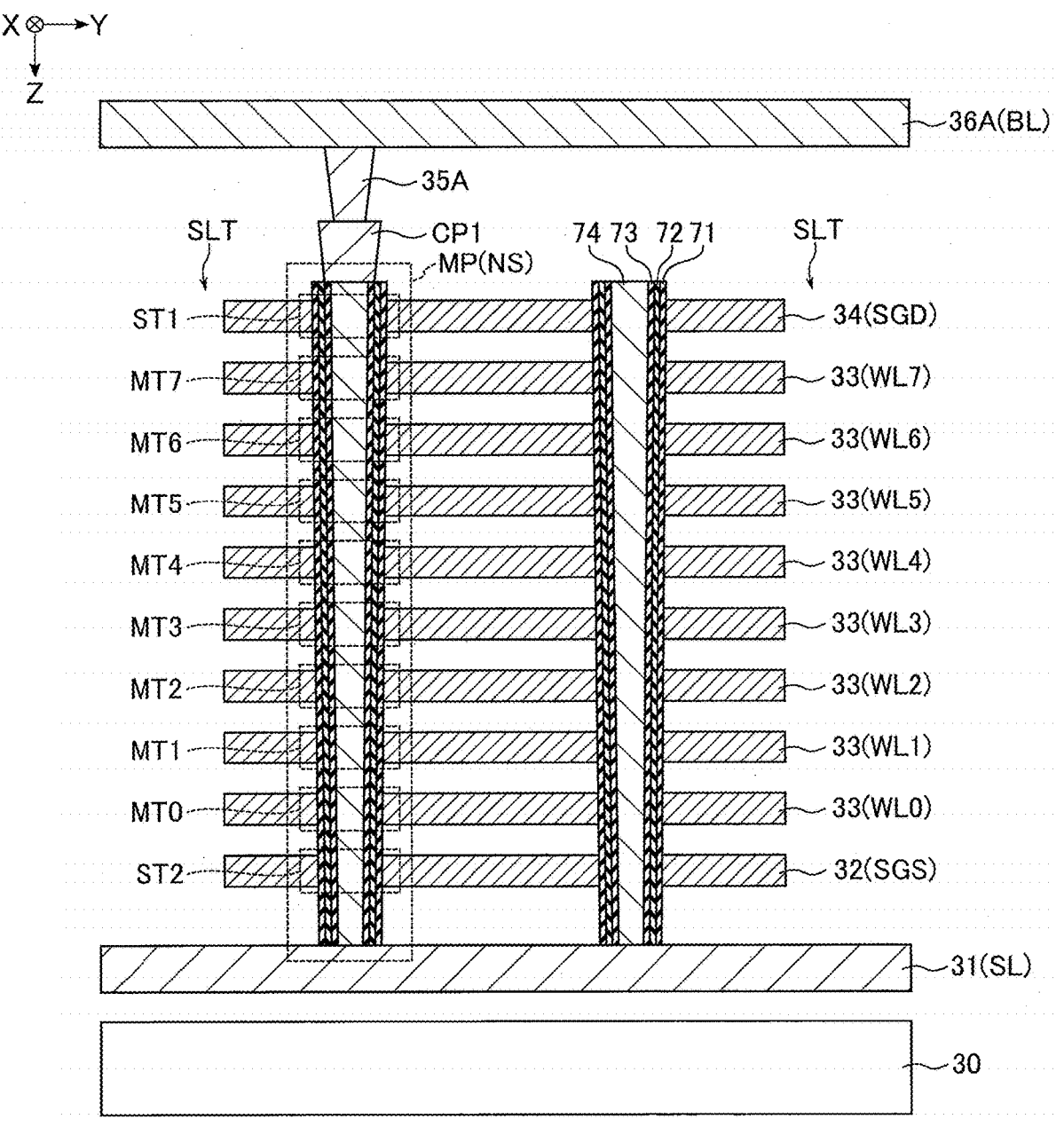
F I G. 5

100 (400)

| 12A | 11A | 12B 12E | | 11C | 12F |

FIG. 6

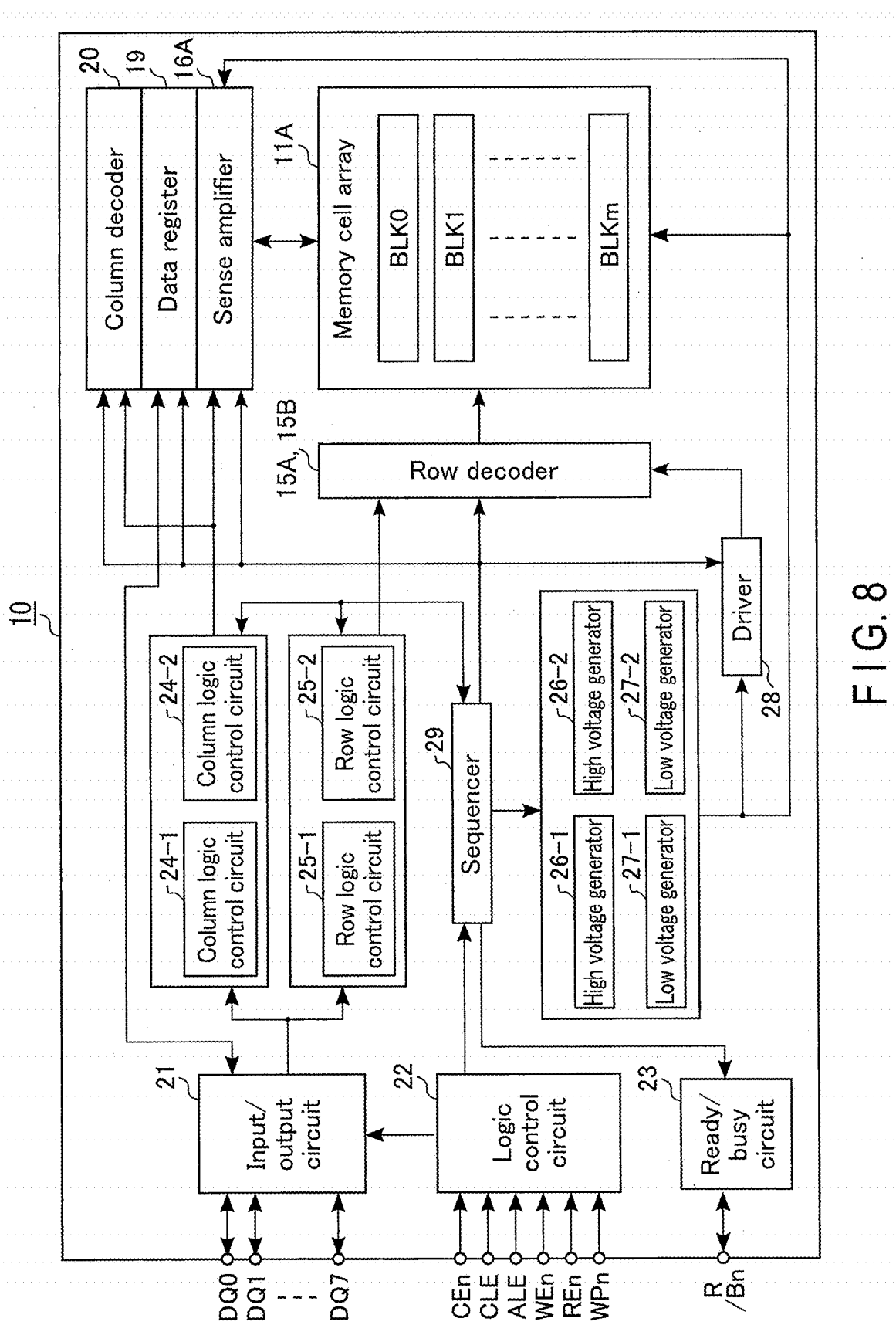
F I G. 8

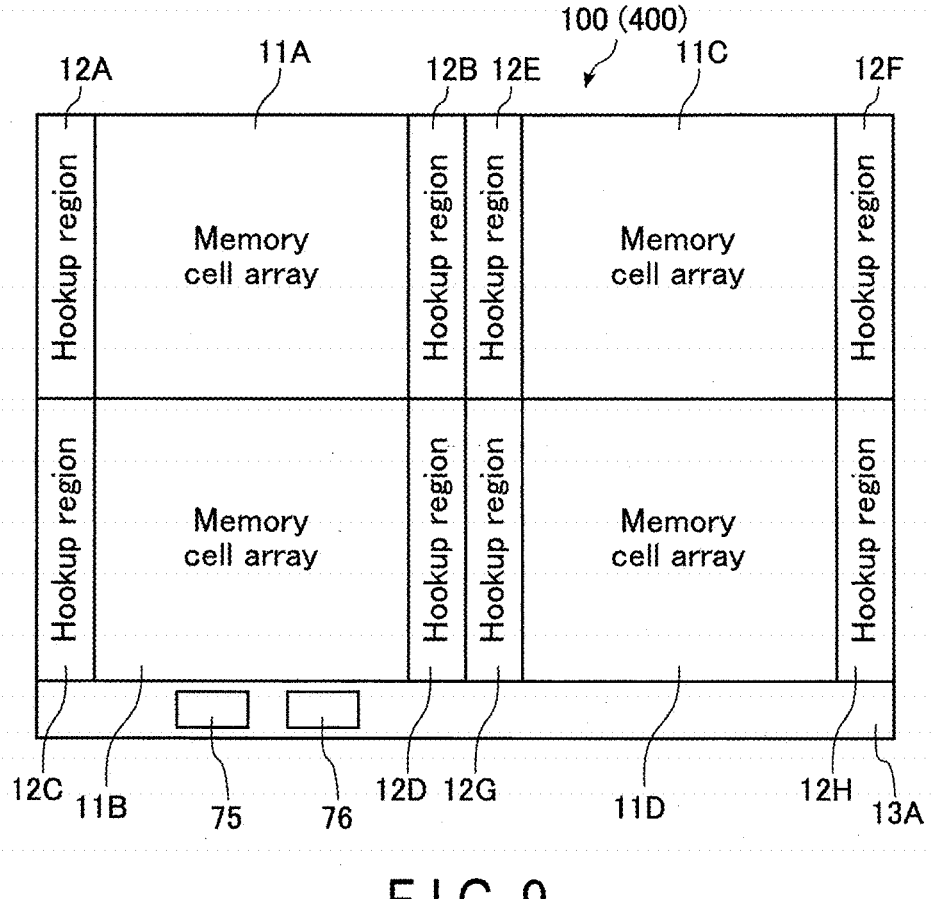
F I G. 9

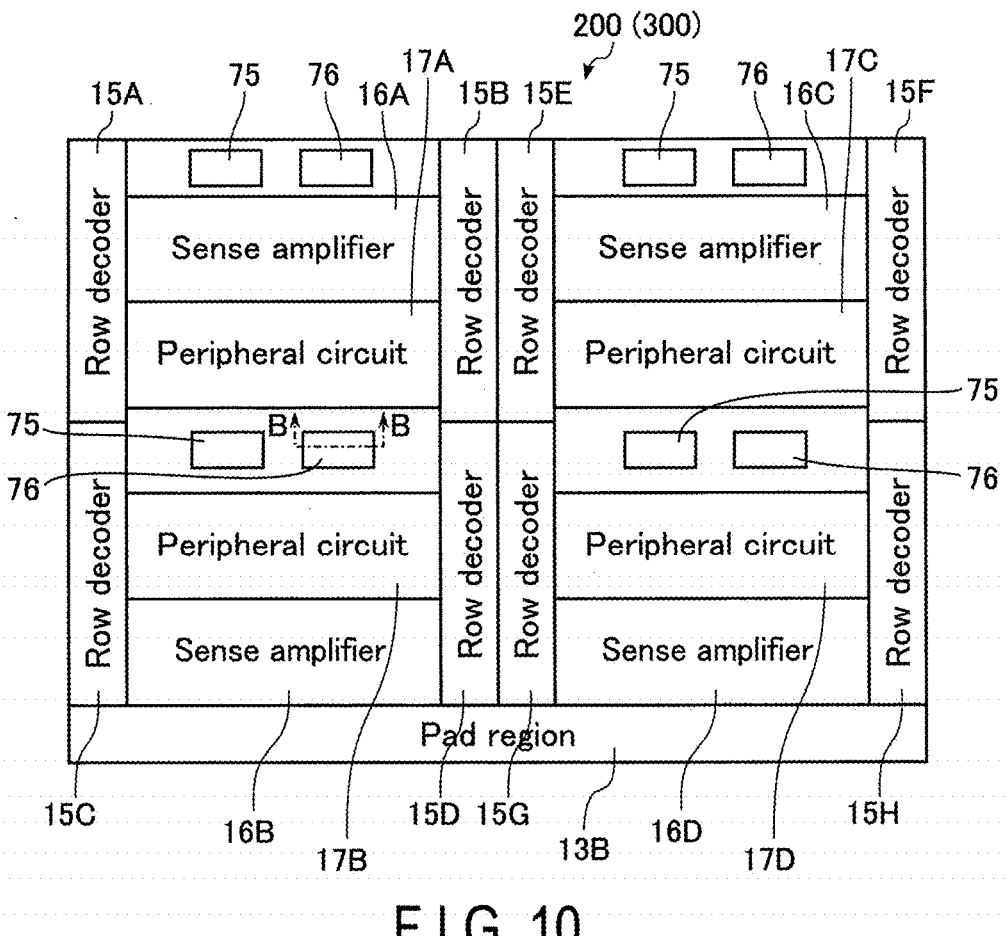
F I G. 10

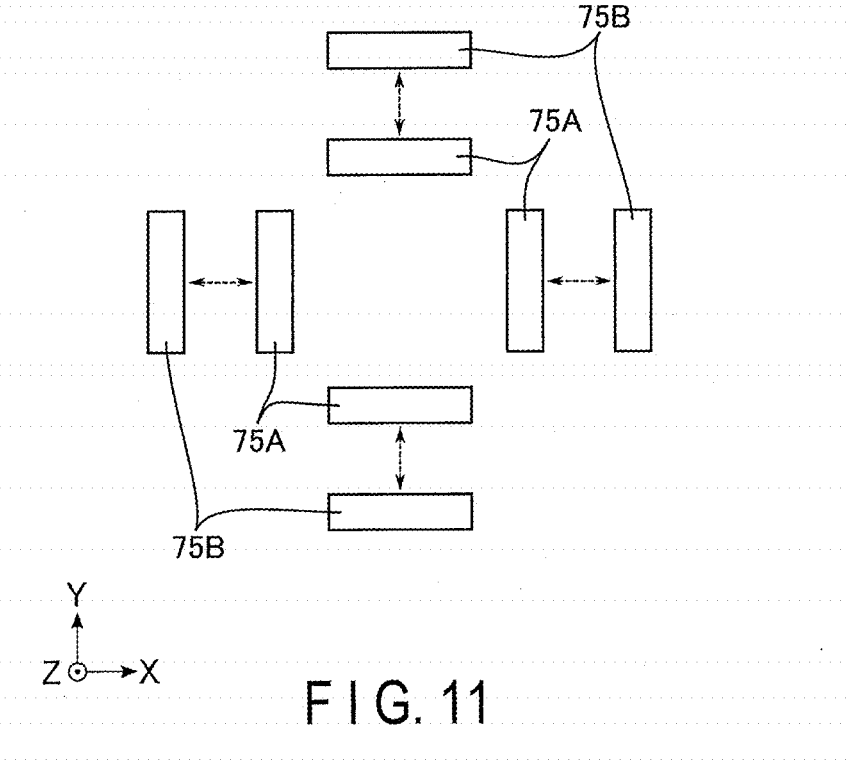
F I G. 11
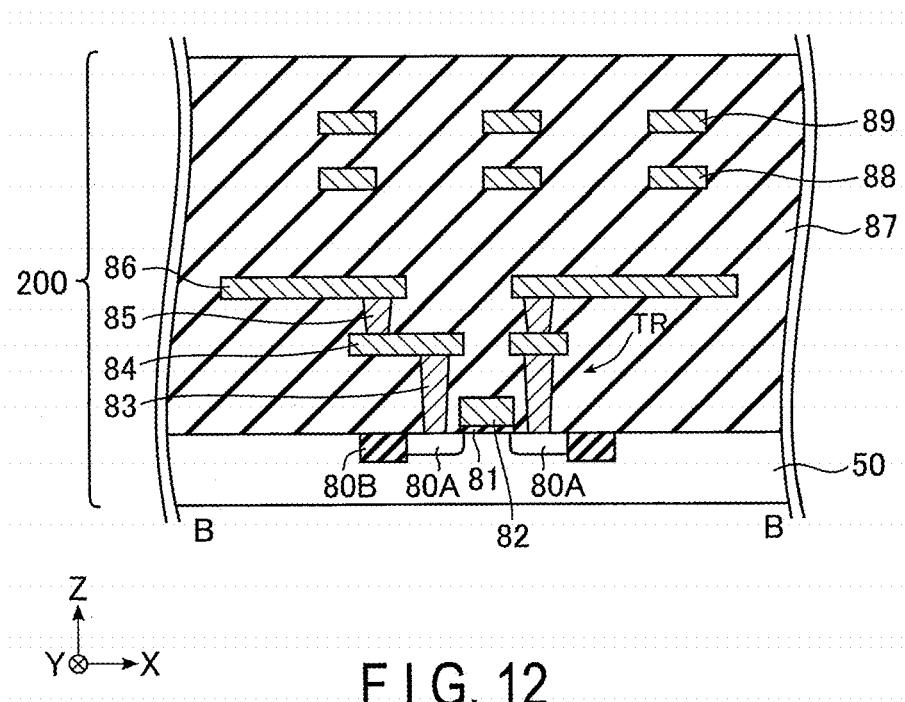
F I G. 12

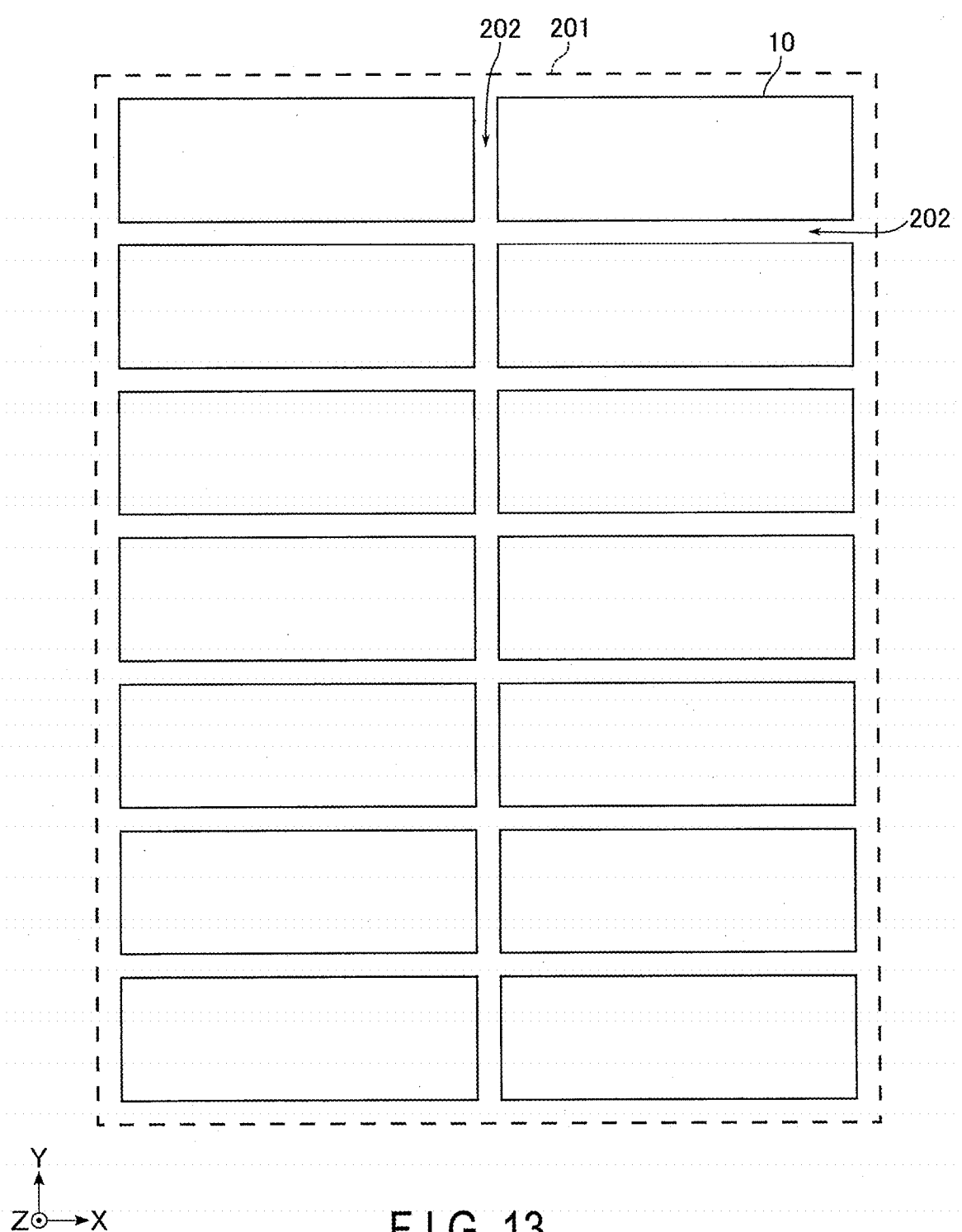
F I G. 13

SEMICONDUCTOR MEMORY DEVICE

CROSS-REFERENCE TO RELATED APPLICATIONS

This application is a continuation of and claims benefit under 35 U.S.C. § 120 to U.S. application Ser. No. 18/056,508, filed Nov. 17, 2022, which is a continuation of and claims benefit under 35 U.S.C. § 120 to U.S. Application Ser. No. 16/806,079, filed Mar. 2, 2020 (now U.S. Pat. No. 11,508,697), which is based upon and claims the benefit of priority under 35 U.S.C. § 119 to Japanese Patent Application No. 2019-169371, filed Sep. 18, 2019, the entire contents of each of which are incorporated by reference in their entirety.

FIELD

Embodiments described herein relate generally to a semiconductor memory device.

BACKGROUND

A semiconductor memory device with three-dimensionally arranged memory cells is known.

BRIEF DESCRIPTION OF THE DRAWINGS

FIG. 4 is a circuit diagram of a block in a memory cell array in the first embodiment.

FIG. 5 is a cross-sectional view of a memory pillar in the memory cell array in the first embodiment.

FIG. 6 is a diagram showing a circuit block configuration of a memory array chip in the first embodiment.

FIG. 8 is a diagram showing a detailed configuration of a circuit block in the semiconductor memory device according to the first embodiment.

FIG. 9 is a diagram showing a circuit block configuration of a memory array chip in a semiconductor memory device according to a second embodiment.

FIG. 10 is a diagram showing a circuit block configuration of a peripheral circuit chip in the semiconductor memory device according to the second embodiment.

FIG. 11 is a plan view showing an alignment mark provided in the peripheral circuit chip in the semiconductor memory device according to the second embodiment.

FIG. 12 is a cross-sectional view showing an example of a TEG provided in the peripheral circuit chip in the semiconductor memory device according to the second embodiment.

FIG. 13 is a plan view showing chips arranged in one reticulum of a wafer in a manufacturing process of a semiconductor memory device of a comparative example.

DETAILED DESCRIPTION

In general, according to one embodiment, a semiconductor memory device includes a memory cell, a first voltage generator and a second voltage generator. The memory cell is provided above a substrate. The first voltage generator is provided between the substrate and the memory cell. The first voltage generator is configured to generate a first voltage to be supplied to the memory cell. The second voltage generator is provided between the substrate and the memory cell. The second voltage generator is configured to generate the first voltage and have a circuit configuration equivalent to the first voltage generator.

Hereinafter, embodiments will be explained with reference to the accompanying drawings. In the descriptions below, the same reference symbols may be used for components having substantially the same functions and configurations. Also, each embodiment will be set forth as an example of devices or methods for embodying the technical idea of the embodiment. The embodiments are not limited to the materials, shapes, structures, arrangement, or the like of the components which will be described.

The description will assume an instance where the semiconductor memory device is a three-dimensionally stacked NAND flash memory that includes memory cell transistors stacked above a semiconductor substrate. In this specification, a memory cell transistor may be referred to as a memory cell.

1. First Embodiment

A semiconductor memory device according to the first embodiment will be described below.

1.1 Configuration of Semiconductor Memory Device

Figure 1:
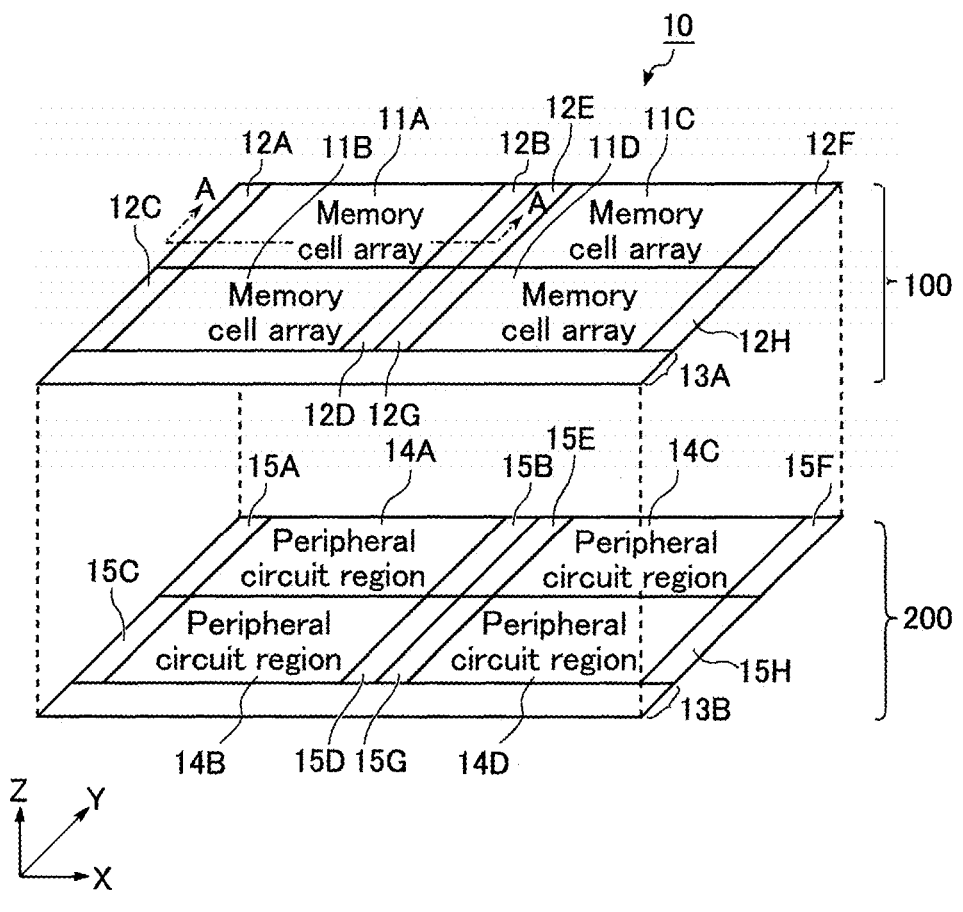
FIG. 1 is a diagram showing a plan layout of a semiconductor memory device according to a first embodiment.

First, an exemplary configuration of the semiconductor memory device according to the first embodiment will be described with reference to FIG. 1. FIG. 1 is a diagram showing an example of a plan layout of the semiconductor memory device according to the first embodiment. FIG. 1 and subsequent drawings assume two directions orthogonal to each other and parallel to a semiconductor substrate surface (or a wafer plane) to be X and Y directions, and a direction orthogonal to (or intersecting) a plane (X-Y plane) including these X and Y directions to be a Z direction. For example, the X direction corresponds to an extension direction of a word line WL to be described later, the Y direction corresponds to an extension direction of a bit line BL, and the Z direction corresponds to a direction orthogonal to the semiconductor substrate surface of a semiconductor memory device 10.

As shown in FIG. 1, the semiconductor memory device 10 includes, for example, a memory array chip 100 and a peripheral circuit chip 200.

The memory array chip 100 includes memory cell arrays 11A, 11B, 11C, and 11D, hookup regions 12A, 12B, 12C, 12D, 12E, 12F, 12G, and 12H, and a pad region 13A. The peripheral circuit chip 200 manages communications with a memory controller (not shown) provided outside. The peripheral circuit chip 200 includes peripheral circuit regions 14A, 14B, 14C, and 14D, row decoders 15A, 15B, 15C, 15D, 15E, 15F, 15G, and 15H, and a pad region 13B. The peripheral circuit regions 14A to 14D and the row decoders 15A to 15H control the memory cell arrays 11A to 11D in the memory array chip 100.

The memory array chip 100 and the peripheral circuit chip 200 are respectively formed by different semiconductor substrates. An electrode pad of a surface of the memory array chip 100 is arranged to be opposed to an electrode pad of a surface of the peripheral circuit chip 200, and the electrode pad of the memory array chip 100 and the electrode pad of the peripheral circuit chip 200 are bonded together. Thereby, one semiconductor memory device (semiconductor memory chip) 10 is formed.

In the memory array chip 100, each of the memory cell arrays 11A to 11D can execute different operations in parallel. The memory cell array 11A is arranged between the hookup region 12A and the hookup region 12B arranged in the X direction. Similarly, the memory cell array 11B is arranged between the hookup region 12C and the hookup region 12D, the memory cell array 11C is arranged between the hookup region 12E and the hookup region 12F, and the memory cell array 11D is arranged between the hookup region 12G and the hookup region 12H.

The hookup regions 12A and 12B are the regions used for electrically connecting the memory cell array 11A provided in the memory array chip 100 and the row decoders 15A and 15B provided in the peripheral circuit chip 200. Similarly, the hookup regions 12C and 12D are the regions used for electrically connecting the memory cell array 11B and the row decoders 15C and 15D. The hookup regions 12E and 12F are the regions used for electrically connecting the memory cell array 11C and the row decoders 15E and 15F. The hookup regions 12G and 12H are the regions used for electrically connecting the memory cell array 11D and the row decoders 15G and 15H.

Pads used for connection between the peripheral circuit chip 200 and the memory controller are provided in the pad region 13A. The pad region 13A is provided to extend in the X direction, and for example, to be adjacent to the memory cell arrays 11B and 11D.

In the peripheral circuit chip 200, the row decoders 15A to 15H are provided to be overlapped with or opposed to the hookup regions 12A to 12H of the memory array chip 100, respectively. For example, the row decoders 15A and 15B are electrically connected to word lines WL provided in the memory cell array 11A. Similarly, the row decoders 15C and 15D are electrically connected to word lines WL provided in the memory cell array 11B. The row decoders 15E and 15F are electrically connected to word lines WL provided in the memory cell array 11C. The row decoders 15G and 15H are electrically connected to word lines WL provided in the memory cell array 11D.

The peripheral circuit region 14A is, for example, provided between the row decoders 15A and 15B. The peripheral circuit region 14B is, for example, provided between the row decoders 15C and 15D. The peripheral circuit region 14C is, for example, provided between the row decoders 15E and 15F. The peripheral circuit region 14D is, for example, provided between the row decoders 15G and 15H. Each of the peripheral circuit regions 14A to 14D includes, for example, a sense amplifier, a peripheral circuit, and a redundancy circuit, to be described later.

The pad region 13B is provided to be adjacent to the peripheral circuit regions 14B and 14D and overlapped with the pad region 13A of the memory array chip 100. In the pad region 13B, for example, interconnects and so on drawn out from peripheral circuits included in the peripheral circuit regions 14A to 14D are arranged. These interconnects are drawn out to an upper surface of the semiconductor memory device 10 by vias and pads.

In the following descriptions, the memory cell array 11A will be described, but the same description as the memory cell array 11A applies to each of the memory cell arrays 11B to 11D.

Figure 2:
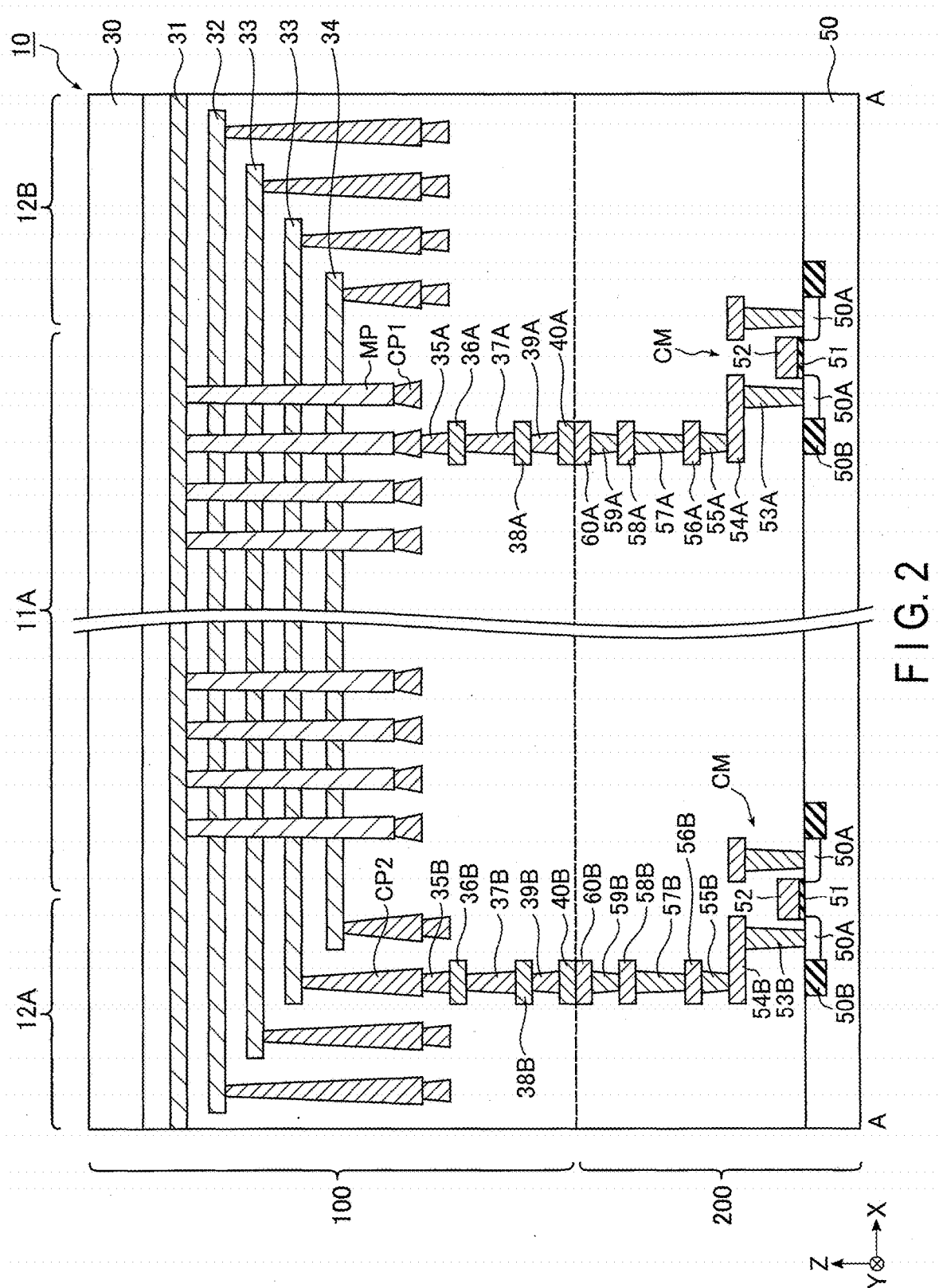
FIG. 2 is a cross-sectional view taken along a line A-A in FIG. 1.

Next, a cross-sectional structure of the semiconductor memory device 10 will be described with reference to FIG. 2. FIG. 2 is a cross-sectional view taken along a line A-A in FIG. 1, and is a cross-sectional view along the X-Z plane including the memory cell array 11A. FIG. 2 shows a cross-sectional structure including the memory cell array 11A, but a cross-sectional structure including each of the memory cell arrays 11B to 11D is similar to the cross-sectional structure shown in FIG. 2. In FIG. 2, interlayer insulating layers between conductive layers are omitted. In the cross-sectional views of FIG. 2 and after, an arrow direction of the Z direction is referred to as a positive direction, and a direction opposite to the arrow direction of the Z direction is referred to as a negative direction. In addition, "above" and "below" in the following descriptions correspond to an upper direction and a lower direction in each drawing, respectively.

As shown in FIG. 2, the semiconductor memory device 10 includes a structure in which the memory array chip 100 and the peripheral circuit chip 200 are bonded together.

A cross-sectional structure of the memory array chip 100 will be described in detail below.

A conductive layer 31 is provided on a semiconductor substrate 30 through an insulating layer in the negative direction of the Z direction. A stack in which a conductive layer 32, a plurality of conductive layers 33, and a conductive layer 34 are stacked through insulating layers in the negative direction of the Z direction is provided on the conductive layer 31. The conductive layers 31 to 34 extend in the X direction. The conductive layers 31 to 34 each have a plate shape along (or parallel to) the X-Y plane (or the semiconductor substrate 30 plane).

The conductive layer 31 functions as a source line SL. The conductive layer 32 functions as a select gate line SGS. The conductive layers 33 function as a plurality of word lines WL0 to WL7, respectively. In FIG. 2, two conductive layers 33 are shown, and the remaining conductive layers 33 are omitted. The conductive layer 34 functions as a select gate line SGD. The conductive layers 31 to 34 include, for example, tungsten (W) or polycrystalline silicon. The semiconductor substrate 30 includes, for example, a silicon substrate and an epitaxial layer of silicon.

A plurality of memory pillars MP each having a columnar shape are provided in a stack including the conductive layers 32 to 34. Each of the memory pillars MP extends in the Z direction. Each of the memory pillars MP is arranged to penetrate the conductive layers 32 to 34 in the Z direction (or a stacking direction), and reaches the conductive layer 31 through the conductive layer 34. Namely, the memory pillar MP is connected to the source line SL through the select gate line SGD, the word lines WL0 to WL7, and the select gate line SGS.

A contact plug CP1 is provided on the memory pillar MP in the negative direction of the Z direction. A via 35A, a conductive layer 36A, a via 37A, a conductive layer 38A, a via 39A, and a conductive pad 40A are provided in this order in the negative direction of the Z direction on the contact plug CP1. Here, an example in which two conductive layers (or interconnect layers, pads) 36A and 38A are provided below the memory pillar MP is indicated, but the number of conductive layers provided below the memory pillar MP is discretionary.

A via 35B is provided at an end portion of each of the conductive layers 32 to 34 extending in the X direction through a contact plug CP2. A conductive layer 36B, a via 37B, a conductive layer 38B, a via 39B, and a conductive pad 40B are provided in this order in the negative direction of the Z direction on the via 35B.

A cross-sectional structure of the peripheral circuit chip 200 will be described in detail below.

For example, CMOS circuits CM including n-channel MOS field-effect transistors (hereinafter, referred to as nMOS transistors) and p-channel MOS field-effect transistors (hereinafter, referred to as pMOS transistors) are provided on the semiconductor substrate 50. The peripheral circuit in the peripheral circuit region 14A and the row decoders 15A and 15B are configured by including a plurality of CMOS circuits CM. The semiconductor substrate 50 may include, for example, a silicon substrate and an epitaxial layer of silicon.

As shown in FIG. 2, source regions 50A, drain regions 50A, and element isolation regions 50B are provided in the semiconductor substrate 50. A gate insulating layer 51 is provided on the semiconductor substrate 50 between the source region 50A and the drain region 50A in the positive direction of the Z direction, and a gate electrode 52 is provided on the gate insulating layer 51. Each of the nMOS transistor and the pMOS transistor includes the source region 50A, the drain region 50A, a semiconductor layer of the semiconductor substrate 50, the gate insulating layer 51, and the gate electrode 52.

Vias 53A are provided on the source region 50A and drain region 50A, respectively, in the positive direction of the Z direction, and conductive layers 54A are provided on the vias 53A, respectively. A via 55A, a conductive layer 56A, a via 57A, a conductive layer 58A, a via 59A, and a conductive pad 60A are provided in this order in the positive direction of the Z direction on the conductive layer 54A. The conductive pad 60A is arranged on the surface of the peripheral circuit chip 200 in the positive direction of the Z direction. Here, an example in which three conductive layers (or interconnect layers, pads) 54A, 56A, and 58A are provided above the nMOS transistor and the pMOS transistor is indicated, but the number of conductive layers provided above the nMOS transistor and the pMOS transistor is discretionary.

The vias 53B are provided on the other source region 50A and drain region 50A, respectively, in the positive direction of the Z direction, and the conductive layers 54B are provided on the vias 53B, respectively. A via 55B, a conductive layer 56B, a via 57B, a conductive layer 58B, a via 59B, and a conductive pad 60B are provided in this order in the positive direction of the Z direction on the conductive layer 54B. The conductive pad 60B is arranged on the surface of the peripheral circuit chip 200 in the positive direction of the Z direction. Here, an example in which three conductive layers (or interconnect layers, pads) 54B, 56B, and 58B are provided above the nMOS transistor and the pMOS transistor is indicated, but the number of conductive layers provided above the nMOS transistor and the pMOS transistor is discretionary.

The memory array chip 100 and the peripheral circuit chip 200 are such that, for example, the conductive pads are bonded together to be opposed to each other, including the conductive pad 40A with the conductive pad 60A, and the conductive pad 40B with the conductive pad 60B. Thereby, the conductive pads of the memory array chip 100 and the peripheral circuit chip 200 including the conductive pad 40A with the conductive pad 60A, and the conductive pad 40B with the conductive pad 60B, are joined together and electrically connected.

Next, another exemplary structure of the semiconductor memory device according to the first embodiment will be described with reference to FIG. 3. In FIG. 2, the semiconductor memory device 10 in which the memory array chip 100 and the peripheral circuit chip 200 are bonded is described as an example, but the configuration is not limited thereto. This suggestion is applicable to semiconductor memory devices having other structures.

Figure 3:
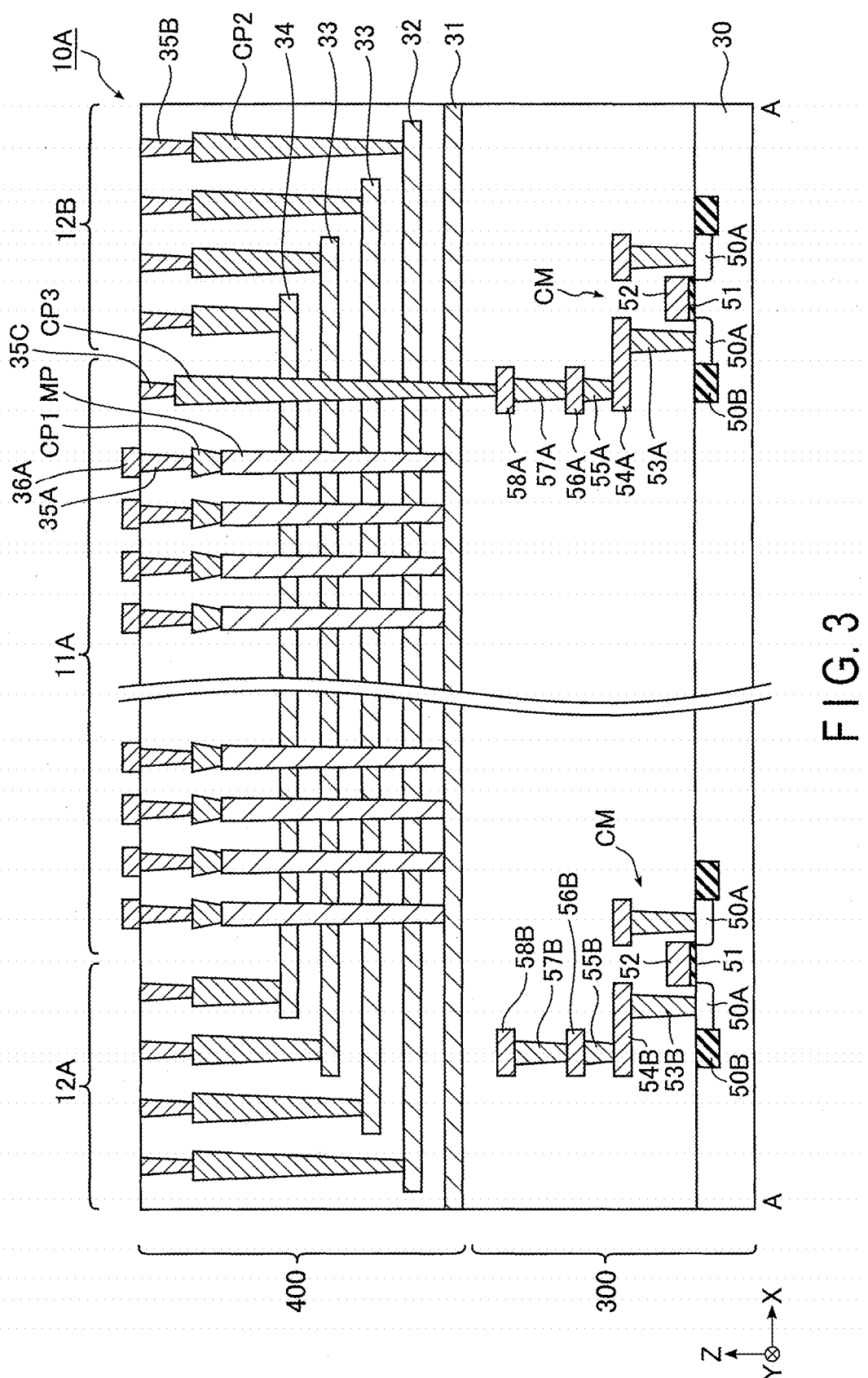
FIG. 3 is a cross-sectional view showing another exemplary structure of the semiconductor memory device according to the first embodiment.

FIG. 3 is a cross-sectional view showing another exemplary structure of the semiconductor memory device according to the first embodiment. For example, this suggestion is also applicable to a semiconductor memory device 10A with a region 300 in which peripheral circuitry is formed on the semiconductor substrate 30, and a region 400 in which a memory cell is formed on the region 300, as shown in FIG. 3. In FIG. 3, interlayer insulating layers between the conductive layers are omitted.

Hereinafter, a cross-sectional structure of the region 300 in which peripheral circuitry is formed is described.

For example, CMOS circuits CM including nMOS transistors and pMOS transistors are provided in the semiconductor substrate 30. The source regions 50A, the drain regions 50A, and the element isolation regions 50B are provided in the semiconductor substrate 30. The gate insulating layer 51 is provided on the semiconductor substrate 30 between the source region 50A and the drain region 50A in the positive direction of the Z direction, and the gate electrode 52 is provided on the gate insulating layer 51. Each of the nMOS transistor and the pMOS transistor includes the source region 50A, the drain region 50A, a semiconductor layer of the semiconductor substrate 30, the gate insulating layer 51, and the gate electrode 52.

The vias 53A are provided on the source region 50A and the drain region 50A, respectively, in the positive direction of the Z direction, and the conductive layers 54A are provided on the vias 53A, respectively. The via 55A, the conductive layer 56A, the via 57A, and the conductive layer 58A are provided in this order in the positive direction of the Z direction on the conductive layer 54A. A contact plug CP3 is provided on the conductive layer 58A in the Z direction. The contact plug CP3 is arranged to penetrate the conductive layers 31 to 34 in the Z direction. Furthermore, a via 35C is provided on the contact plug CP3 in the Z direction. For example, the via 35C is electrically connected to the conductive layer 36A (or the bit line BL) through interconnect layers and vias (not shown).

The vias 53B are provided on the other source region 50A and drain region 50A, respectively, in the positive direction of the Z direction, and the conductive layers 54B are provided on the vias 53B, respectively. The via 55B, the conductive layer 56B, the via 57B, and the conductive layer 58B are provided in this order in the positive direction of the Z direction on the conductive layer 54B. For example, the conductive layer 58B is electrically connected to the via 35B through interconnect layers and vias (not shown).

Hereinafter, a cross-sectional structure of the region 400 in which memory cells are formed is described.

The region 400 is provided above the region 300. A plurality of memory pillars MP each having a columnar shape are provided in a stack including the conductive layers 32 to 34 above the region 300 on the semiconductor substrate 30. Each memory pillar MP extends in the Z direction, and is arranged to penetrate the conductive layers 32 to 34 in the Z direction.

The contact plug CP1 is provided on the memory pillar MP in the positive direction of the Z direction. The via 35A and the conductive layer 36A are provided on the contact plug CP1 in this order in the positive direction of the Z direction. The memory pillars MP will be described in more detail later.

At an end portion of each of the conductive layers 32 to 34 extending in the X direction, the via 35B is provided through the contact plug CP2 in the positive direction of the Z direction.

Next, a circuit configuration of the memory cell array 11A will be described with reference to FIG. 4. The memory cell array 11A includes a plurality of blocks BLK0 to BLKm (m is an integer of 0 or more). Description will now be given of the circuit configuration of one block BLK, but the circuit configurations of the other blocks are the same. Furthermore, the circuit configuration of each of the memory cell arrays 11B to 11D is the same as that of the memory cell array 11A.

FIG. 4 is a circuit diagram of one block BLK in the memory cell array 11A. The block BLK includes, for example, a plurality of string units SU0 to SU3. Here, an example in which the block BLK includes the string units SU0 to SU3 is indicated, but the number of string units included in the block BLK can be set discretionarily. In principle, the following description will use "string unit SU" to refer to any one of the string units SU0 to SU3.

Each of the string units SU0 to SU3 includes NAND strings (or memory strings) NS. The number of the NAND strings NS included in one string unit SU can be set discretionarily.

The NAND strings NS each include a plurality of memory cell transistors MT0 to MT7, and select transistors ST1 and ST2. Here, for ease of explanation, an example in which the NAND string NS includes eight memory cell transistors MT0 to MT7 and two select transistors ST1 and ST2 is indicated, but the number of memory cell transistors and that of select transistors included in the NAND string NS can be set discretionarily. In principle, the following description will use "memory cell transistor MT" to refer to any one of the memory cell transistors MT0 to MT7.

Each of the memory cell transistors MT0 to MT7 includes a control gate and a charge storage layer, and stores data in a nonvolatile manner. The memory cell transistors MT0 to MT7 are connected in series between the source of the select transistor ST1 and the drain of the select transistor ST2.

The memory cell transistor MT is capable of storing data of 1 bit or data of 2 bits or more. The memory cell transistor MT may be of a MONOS (metal-oxide-nitride-oxide-silicon) type using insulating films for charge storage layers, or an FG (floating gate) type using conductive layers for charge storage layers.

Gates of a plurality of select transistors ST1 included in the string unit SU0 are connected to a select gate line SGD0. Similarly, gates of the select transistors ST1 of each of the string units SU1 to SU3 are connected to select gate lines SGD1 to SGD3, respectively. Each of the select gate lines SGD0 to SGD3 is independently controlled by a row decoder.

Gates of a plurality of select transistors ST2 included in the string unit SU0 are connected to a select gate line SGS. Similarly, gates of the select transistors ST2 of each of the string units SU1 to SU3 are connected to the select gate line SGS. To the gates of the select transistors ST2 of the string units SU0 to SU3 included in the block BLK, individual select gate lines SGS, i.e., select gate lines SGS0 to SGS3, may be connected, respectively. The select transistors ST1 and ST2 are used to select a string unit SU when performing various operations.

The control gates of the memory cell transistors MT0 to MT7 included in the block BLK are connected to the word lines WL0 to WL7, respectively. Each of the word lines WL0 to WL7 is independently controlled by a row decoder.

Each of the bit lines BL0 to BLi (i is an integer of 0 or more) is connected to a plurality of blocks BLK, and connected to one NAND string NS within each string unit SU included in the blocks BLK. That is, each of the bit lines BL0 to BLi is connected to the drains of the select transistors ST1 in a plurality of NAND strings NS arranged on the same column among the NAND strings NS arranged in a matrix within the block BLK. The source line SL is connected to a plurality of blocks BLK. That is, the source line SL is connected to the sources of the select transistors ST2 included in the block BLK.

In short, one string unit SU includes the NAND strings NS connected to different bit lines BL and the same select gate line SGD. The block BLK includes the string units SU sharing the word lines WL. Furthermore, the memory cell array 11A includes the blocks BLK sharing the bit lines BL.

A block BLK is, for example, a unit of data erasure. That is, data stored in the memory cell transistors MT included in the same block BLK is erased at once. Note that data may be erased in string units SU, or in a unit smaller than one string unit SU.

A group of memory cell transistors MT connected to a common word line WL within one string unit SU is called a "cell unit CU". A collection of 1-bit data items respectively stored in the memory cell transistors MT included in the cell unit CU is called a "page". The cell unit CU varies its storage capacity depending on the number of bits of data stored each of by the memory cell transistors MT. For example, the cell unit CU stores 1-page data when each memory cell transistor MT is adapted to store 1-bit data, stores 2-page data when each memory cell transistor MT is adapted to store 2-bit data, and stores 3-page data when each memory cell transistor MT is adapted to store 3-bit data.

Write and read operations for the cell unit CU are performed in units of a page. In other words, write and read operations are performed at once for a group of memory cell transistors MT connected to one word line WL arranged in one string unit SU.

Moreover, the memory cell arrays 11A to 11D may adopt other structures. For such structures of the memory cell arrays 11A to 11D, for example, reference may be made to the disclosure in U.S. patent application Ser. No. 12/407,403 filed Mar. 19, 2009 and titled "THREE DIMENSIONAL STACKED NONVOLATILE SEMICONDUCTOR MEMORY". Reference may also be made to the disclosure in U.S. patent application Ser. No. 12/406,524 filed Mar. 18, 2009 and titled "THREE DIMENSIONAL STACKED NONVOLATILE SEMICONDUCTOR MEMORY", the disclosure in U.S. patent application Ser. No. 12/679,991 filed Mar. 25, 2010 and titled "NON-VOLATILE SEMI-CONDUCTOR STORAGE DEVICE AND METHOD OF MANUFACTURING THE SAME", and the disclosure in U.S. patent application Ser. No. 12/532,030 filed Mar. 23, 2009 and titled "SEMICONDUCTOR MEMORY AND METHOD FOR MANUFACTURING SAME". The entire contents of these applications are incorporated herein by reference.

Next, description will be given of a cross-sectional structure of the memory pillars MP (or, the NAND strings NS) in the memory cell array 11A, with reference to FIG. 5. In the following descriptions, the memory pillars MP in the memory cell array 11A will be described, but the same description applies to the memory pillars MP in each of the memory cell arrays 11B to 11D. The memory pillars MP each include the memory cell transistors MT0 to MT7 and the select transistors ST1 and ST2.

FIG. 5 is a cross-sectional view of the memory pillars MP in the memory cell array 11A according to the first embodiment. FIG. 5 shows a 180-degree rotated state of the memory pillars MP shown in FIG. 2, and a non-rotated state of the memory pillars MP shown in FIG. 3. In FIG. 5, interlayer insulating layers between the conductive layers are omitted.

As shown in FIG. 5, the memory cell array 11A includes the semiconductor substrate 30, the conductive layers 31 to 34, the memory pillars MP, the contact plug CP1, the via 35A, and the conductive layer 36A. The conductive layer 31 is provided above the semiconductor substrate 30. The conductive layer 31 is of a flat plate shape along the X-Y plane, and functions as the source line SL. A main surface of the semiconductor substrate 30 corresponds to the X-Y plane.

A plurality of slits SLT along the X-Z plane are arranged in the Y direction on the conductive layer 31. A structure (or a stack) between the adjacent slits SLT on the conductive layer 31, for example, corresponds to one string unit SU.

The conductive layer 32, the conductive layers 33, the conductive layer 34, and the conductive layer 36A are located between the adjacent slits SLT on the conductive layer 31, and sequentially provided in this order from the bottom. Among these conductive layers, the conductive layers adjacent in the Z direction are stacked with an interlayer insulating layer therebetween. Each of the conductive layers 32 to 34 is of a flat plate shape along the X-Y plane. The conductive layer 32 functions as the select gate line SGS. The conductive layers 33 function as the word lines WL0 to WL7, respectively, from the bottom. The conductive layer 34 functions as the select gate line SGD. The conductive layers 31 to 34 include, for example, tungsten (W) or polycrystalline silicon.

The memory pillars MP are arranged in, for example, a staggered pattern in the X and Y directions. Each of the memory pillars MP extends (or penetrates) in the Z direction through the stack between the slits SLT. Each of the memory pillars MP penetrates through the conductive layers 34, 33, and 32, so as to extend from the upper surface of the conductive layer 34 and reach the upper surface of the conductive layer 31. Each of the memory pillars MP functions as one NAND string NS.

The memory pillars MP each include, for example, a block insulating layer 71, a charge storage layer 72, a tunnel insulating layer (also referred to as a tunnel insulating film) 73, and a semiconductor layer 74. More specifically, the block insulating layer 71 is disposed on the inner wall of a memory hole for forming each memory pillar MP. The charge storage layer 72 is disposed on the inner wall of the block insulating layer 71. The tunnel insulating layer 73 is disposed on the inner wall of the charge storage layer 72. Further, the semiconductor layer 74 is provided further inside than the tunnel insulating layer 73. The memory pillars MP may also adopt a structure in which a core insulating layer is arranged within the semiconductor layer 74.

With the structure of each memory pillar MP as described, a portion where the memory pillar MP intersects the conductive layer 32 functions as the select transistor ST2. Portions where the memory pillar MP intersects the conductive layers 33 function as the memory cell transistors MT0 to MT7, respectively. Further, a portion where the memory pillar MP intersects the conductive layer 34 functions as the select transistor ST1.

The semiconductor layer 74 functions as a channel layer for the memory cell transistors MT and the select transistors ST1 and ST2. A current path of the NAND string NS is formed within the semiconductor layer 74.

The charge storage layer 72 has a function of storing electric charges injected from the semiconductor layer 74 in the memory cell transistor MT. The charge storage layer 72 includes, for example, a silicon nitride layer.

The tunnel insulating layer 73 functions as a potential barrier when electric charges are injected from the semiconductor layer 74 into the charge storage layer 72 or when electric charges stored in the charge storage layer 72 are released to the semiconductor layer 74. The tunnel insulating layer 73 includes, for example, a silicon oxide layer.

The block insulating layer 71 prevents electric charges stored in the charge storage layer 72 from being released to the conductive layers 33 (word lines WL). The block insulating layer 71 includes, for example, a silicon oxide layer and a silicon nitride layer.

The conductive layer 36A is provided on the upper surface of the memory pillar MP through the contact plug CP1 and the via 35A. The conductive layer 36A is an interconnect layer in a linear shape extending in the Y direction, and functions as the bit line BL. More than one conductive layer 36A is arranged in the X direction, and each is electrically connected to the corresponding single memory pillar MP for one string unit SU. More specifically, for each string unit SU, the contact plug CP1 is provided on the semiconductor layer 74 in one memory pillar MP, the via 35A is provided on the contact plug CP1, and one conductive layer 36A is provided on the via 35A. The conductive layer 36A includes, for example, copper (Cu) or aluminum (Al), and tungsten (W). The contact plug CP1 and the via 35A include a conductive layer, e.g., tungsten (W).

The numbers of the word lines WL and the select gate lines SGD and SGS are not limited to the above-described numbers, and are changed according to the numbers of the memory cell transistors MT and the select transistors ST1 and ST2, respectively. The select gate line SGS may be constituted by conductive layers provided in respective layers. The select gate line SGD may be constituted by conductive layers provided in respective layers.

Next, a circuit block configuration of the semiconductor memory device 10 (or 10A) according to the first embodiment will be described with reference to FIGS. 6 and 7. The semiconductor memory device 10 comprises a peripheral circuit for a memory cell array, and a redundancy circuit with which this peripheral circuit is replaced when the peripheral circuit is not performing well.

Figure 6:
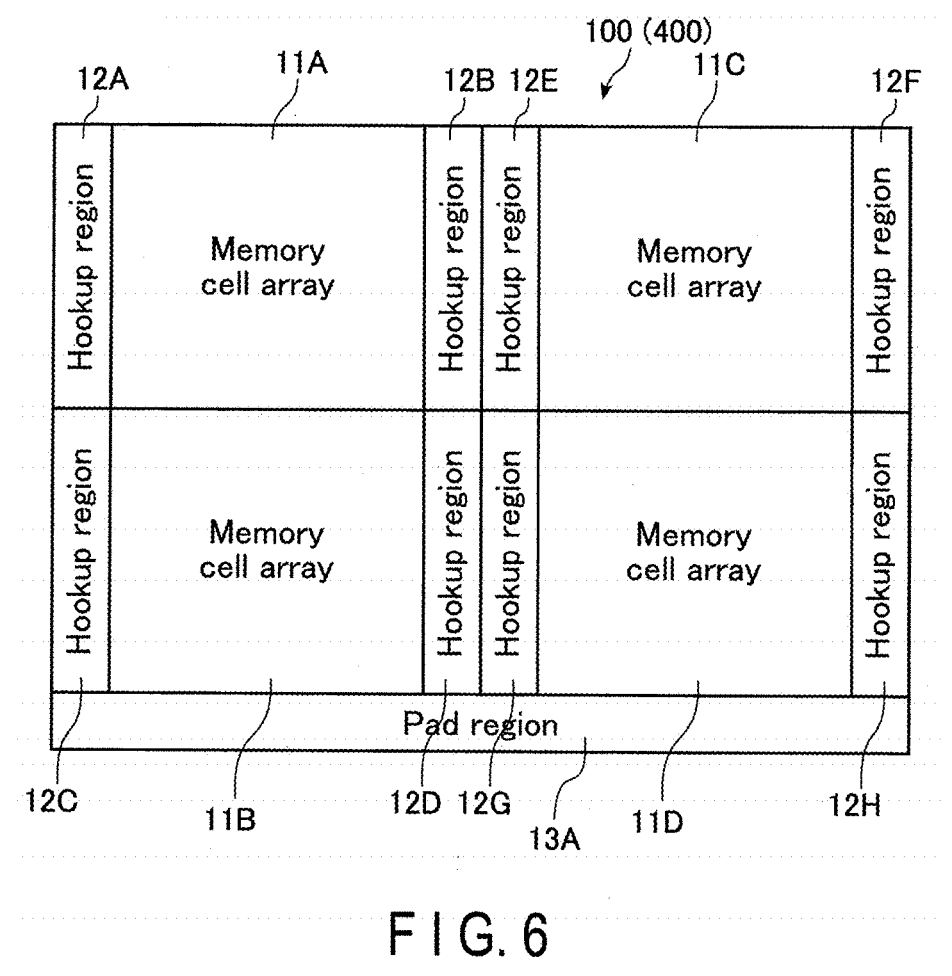

FIG. 6 is a diagram showing a circuit block configuration of the memory array chip 100 in the semiconductor memory device 10 according to the first embodiment.

As described above, the memory cell array 11A is arranged between the hookup region 12A and the hookup region 12B. Similarly, the memory cell array 11B is arranged between the hookup region 12C and the hookup region 12D, the memory cell array 11C is arranged between the hookup region 12E and the hookup region 12F, and the memory cell array 11D is arranged between the hookup region 12G and the hookup region 12H. The pad region 13A is provided to be adjacent to the memory cell arrays 11B and 11D.

Figure 7:
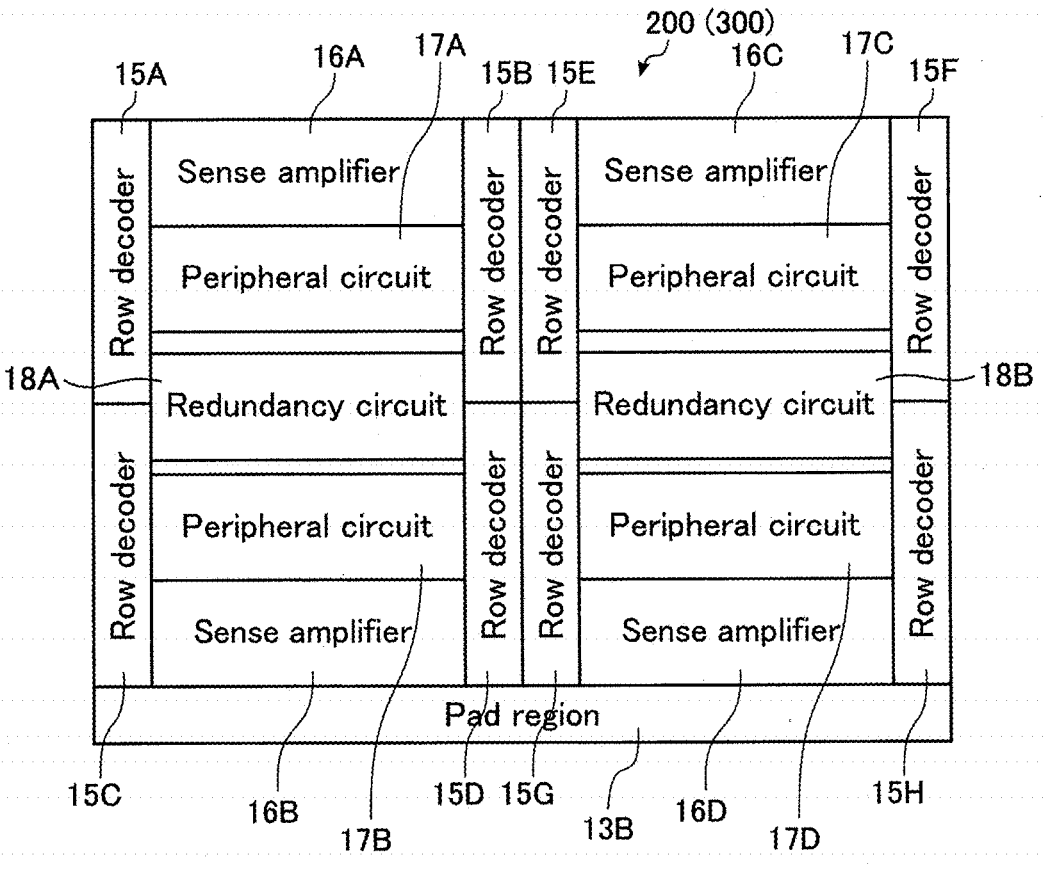
FIG. 7 is a diagram showing a circuit block configuration of a peripheral circuit chip in the first embodiment.

FIG. 7 is a diagram showing a circuit block configuration of the peripheral circuit chip 200 in the semiconductor memory device 10 according to the first embodiment.

The peripheral circuit chip 200 includes sense amplifiers 16A to 16D, peripheral circuits 17A to 17D, redundancy circuits 18A and 18B, the row decoders 15A to 15H, and the pad region 13B.

In a top view shown in FIG. 7, the sense amplifier 16A, the peripheral circuit 17A, the redundancy circuit 18A, the row decoder 15A, and the row decoder 15B are provided in the upper-left area. The sense amplifier 16A and the peripheral circuit 17A are arranged between the row decoder 15A and the row decoder 15B arranged in the X direction. The sense amplifier 16A, the peripheral circuit 17A, the row decoder 15A, the row decoder 15B, and the redundancy circuit 18A are associated with the memory cell array 11A.

In the lower-left area, the sense amplifier 16B, the peripheral circuit 17B, the row decoder 15C, and the row decoder 15D are provided. The sense amplifier 16B and the peripheral circuit 17B are arranged between the row decoder 15C and the row decoder 15D arranged in the X direction. The sense amplifier 16B, the peripheral circuit 17B, the row decoder 15C, the row decoder 15D, and the redundancy circuit 18A are associated with the memory cell array 11B.

The redundancy circuit 18A is arranged between the row decoders 15A and 15C arranged in the Y direction and the row decoders 15B and 15D arranged in the Y direction. Alternatively, the redundancy circuit 18A may be arranged between the row decoder 15A and the row decoder 15B, or between the row decoder 15C and the row decoder 15D. Furthermore, the redundancy circuit 18A is arranged between and adjacent to the peripheral circuit 17A and the peripheral circuit 17B.

For example, a switch circuit (not shown) is provided between the peripheral circuit 17A and the redundancy circuit 18A, and either one of the peripheral circuit 17A and the redundancy circuit 18A is selected by this switch circuit. A switch circuit (not shown) is provided between the peripheral circuit 17B and the redundancy circuit 18A, and either one of the peripheral circuit 17B and the redundancy circuit 18A is selected by this switch circuit.

In the top view shown in FIG. 7, the sense amplifier 16C, the peripheral circuit 17C, the redundancy circuit 18B, the row decoder 15E, and the row decoder 15F are provided in the upper-right area. The sense amplifier 16C and the peripheral circuit 17C are arranged between the row decoder 15E and the row decoder 15F arranged in the X direction. The sense amplifier 16C, the peripheral circuit 17C, the row decoder 15E, the row decoder 15F, and the redundancy circuit 18B are associated with the memory cell array 11C.

In the lower-right area, the sense amplifier 16D, the peripheral circuit 17D, the row decoder 15G, and the row decoder 15H are provided. The sense amplifier 16D and the peripheral circuit 17D are arranged between the row decoder 15G and the row decoder 15H arranged in the X direction. The sense amplifier 16D, the peripheral circuit 17D, the row decoder 15G, the row decoder 15H, and the redundancy circuit 18B are associated with the memory cell array 11D.

The redundancy circuit 18B is arranged between the row decoders 15E and 15G arranged in the Y direction and the row decoders 15F and 15H arranged in the Y direction. Alternatively, the redundancy circuit 18B may be arranged between the row decoder 15E and the row decoder 15F, or between the row decoder 15G and the row decoder 15H. Furthermore, the redundancy circuit 18B is arranged between and adjacent to the peripheral circuit 17C and the peripheral circuit 17D.

For example, a switch circuit (not shown) is provided between the peripheral circuit 17C and the redundancy circuit 18B, and either one of the peripheral circuit 17C and the redundancy circuit 18B is selected by this switch circuit. A switch circuit (not shown) is provided between the peripheral circuit 17D and the redundancy circuit 18B, and either one of the peripheral circuit 17D and the redundancy circuit 18B is selected by this switch circuit.

The redundancy circuit 18A has a configuration equivalent to that of each of the peripheral circuits 17A and 17B, and has the same function as that of each of the peripheral circuits 17A and 17B. The redundancy circuit 18B has a configuration equivalent to each of the peripheral circuits 17C and 17D, and has the same function as that of each of the peripheral circuits 17C and 17D. Details of the redundancy circuits 18A and 18B will be described later.

The redundancy circuit 18A operates instead of the peripheral circuit 17A or 17B when there is a failure in the peripheral circuit 17A or 17B and the peripheral circuit does not operate properly. That is, if there is a defect in the peripheral circuit 17A or the peripheral circuit 17B and the peripheral circuit 17A or 17B does not perform well, the failed peripheral circuit 17A or 17B is replaced with the redundancy circuit 18A. Similarly, the redundancy circuit 18B operates instead of the peripheral circuit 17C or 17D when there is a failure in the peripheral circuit 17C or 17D and the peripheral circuit does not operate properly. That is, if there is a defect in the peripheral circuit 17C or the peripheral circuit 17D and the peripheral circuit 17C or 17D does not perform well, the failed peripheral circuit 17C or 17D is replaced with the redundancy circuit 18B.

In the description of the above-described circuit block configuration, the semiconductor memory device 10 is described as an example, but the semiconductor memory device 10A also has a similar circuit block configuration. The semiconductor memory device 10A is not divided into the peripheral circuit chip 200 and the memory array chip 100, but the peripheral circuit chip 200 can be regarded as the region 300 in which peripheral circuitry is formed, and the memory array chip 100 can be regarded as the region 400 in which memory cells are formed.

Next, a detailed configuration of the circuit block of the semiconductor memory device 10 (or 10A) according to the first embodiment will be described with reference to FIG. 8. FIG. 8 is a diagram showing a detailed configuration of the circuit block of the semiconductor memory device 10. FIG. 8 shows configurations of the memory cell array 11A and peripheral circuitry corresponding to the memory cell array 11A, etc.

The semiconductor memory device 10 includes the memory cell array 11A, the row decoders 15A and 15B, the sense amplifier 16A, a data register 19, a column decoder 20, an input/output circuit 21, a logic control circuit 22, a ready/busy circuit 23, column logic control circuits 24-1 and 24-2, row logic control circuits 25-1 and 25-2, high voltage generators 26-1 and 26-2, low voltage generators 27-1 and 27-2, a driver 28, and a sequencer (or a control circuit) 29.

The peripheral circuit 17A shown in FIG. 7 includes, for example, the column logic control circuit 24-1, the row logic control circuit 25-1, the high voltage generator 26-1, and the low voltage generator 27-1. The redundancy circuit 18A includes, for example, the column logic control circuit 24-2, the row logic control circuit 25-2, the high voltage generator 26-2, and the low voltage generator 27-2.

The redundancy circuit 18A has a configuration equivalent to that of the peripheral circuit 17A, and has the same function as that of the peripheral circuit 17A. That is, the column logic control circuit 24-2 has a configuration equivalent to that of the column logic control circuit 24-1, and has the same function as that of the column logic control circuit 24-1. Similarly, the row logic control circuit 25-2 has a configuration equivalent to that of the row logic control circuit 25-1, and has the same function as that of the row logic control circuit 25-1. The high voltage generator 26-2 has a configuration equivalent to that of the high voltage generator 26-1, and has the same function as that of the high voltage generator 26-1. Furthermore, the low voltage generator 27-2 has a configuration equivalent to that of the low voltage generator 27-1, and has the same function as that of the low voltage generator 27-1.

The memory cell array 11A includes one or more blocks BLK0, BLK1, BLK2, . . . , and BLKm. Each of the blocks BLK includes a plurality of memory cell transistors associated with rows and columns. The memory cell transistors are electrically rewritable nonvolatile memory cells. In the memory cell array 11A, a plurality of word lines, a plurality of bit lines, and a source line are arranged in order to control voltages to be applied to the memory cell transistors. In principle, the following description will use "block BLK" to refer to any one of the blocks BLK0 to BLKm. A specific configuration of the block BLK is as described above.

The input/output circuit 21 and the logic control circuit 22 are connected to an external device (e.g., a memory controller) (not shown) through a bus. The input/output circuit 21 transmits and receives signals DQ (e.g., DQ0, DQ1, DQ2, . . . . DQ7) with a memory controller through a bus.

The logic control circuit 22 receives external control signals from a memory controller through a bus. The external control signals include, for example, a chip enable signal CEn, a command latch enable signal CLE, an address latch enable signal ALE, a write enable signal WEn, a read enable signal REn, and a write protect signal WPn. "n" added to the signal name indicates that the signal is active low.

The chip enable signal CEn enables selection of the semiconductor memory device (NAND-type flash memory) 10, and is asserted when selecting this semiconductor memory device 10. The command latch enable signal CLE enables latching of a command transmitted as a signal DQ into the input/output circuit 21. The address latch enable signal ALE enables latching of an address transmitted as a signal DQ into the input/output circuit 21. The write enable signal WEn enables storing of data transmitted as a signal DQ in the input/output circuit 21. The read enable signal REn enables outputting, as a signal DQ, data read from the memory cell array 11A. The write protect signal WPn is asserted when prohibiting write and erase for the semiconductor memory device 10.

The ready/busy circuit 23 generates a ready/busy signal R/Bn according to control from the sequencer 29. The signal R/Bn indicates whether the semiconductor memory device 10 is in a ready state or in a busy state. A ready state indicates a state in which a command from a memory controller can be received. A busy state indicates a state in which a command from a memory controller cannot be received. The memory controller can know whether the semiconductor memory device 10 is ready or busy by receiving the signal R/Bn from the semiconductor memory device 10.

The column logic control circuits 24-1 and 24-2 receive a column address from the input/output circuit 21, and decode this column address. Based on a decoding result of the column address, the column logic control circuits 24-1 and 24-2 set a voltage of the sense amplifier 16A, and control a voltage to be supplied to the sense amplifier 16A. The column logic control circuits 24-1 and 24-2 decode a column address, and based on a decoding result of the column address, select a bit line BL and control a voltage to be supplied to the selected bit line BL.

The row logic control circuits 25-1 and 25-2 receive a row address from the input/output circuit 21, and decode this row address. Based on a decoding result of the row address, the row logic control circuits 25-1 and 25-2 output a signal to select operation target block and page. The row logic control circuits 25-1 and 25-2 also control voltages to be supplied to the word lines WL and the select gate lines. An address includes a row address, and the row address includes, for example, a block address designating an operation target block BLK, and a page address designating an operation target word line within the designated block.

The sequencer 29 receives a command input from an external device to the input/output circuit 21, and comprehensively controls the semiconductor memory device 10 in accordance with a sequence based on this command. The sequencer 29 controls, for example, the row decoders 15A and 15B, the sense amplifier 16A, the data register 19, the column decoder 20, the driver 28, the column logic control circuits 24-1 and 24-2, the row logic control circuits 25-1 and 25-2, the high voltage generators 26-1 and 26-2, the low voltage generators 27-1 and 27-2, etc. to execute a write operation, a read operation, and an erase operation.

Specifically, the sequencer 29 controls the driver 28, the row decoders 15A and 15B, the column decoder 20, the data register 19, and the sense amplifier 16A to write data into a plurality of memory cell transistors designated by the address, based on a received write command. The sequencer 29 also controls the row decoders 15A and 15B, the driver 28, and the sense amplifier 16A to read data from a plurality of memory cell transistors designated by the address, based on a received read command.

The driver 28 receives a plurality of voltages from the high voltage generators 26-1 and 26-2 and the low voltage generators 27-1 and 27-2. The driver 28 supplies a plurality of voltages selected, from the voltages supplied from the high voltage generators 26-1 and 26-2 and the low voltage generators 27-1 and 27-2, according to a read operation, a write operation, and an erase operation, to the row decoders 15A and 15B through a plurality of signal lines.

The row decoders 15A and 15B select any one of the blocks BLK, and further select a word line in the selected block BLK, based on the decoding result of the row address received from the row logic control circuit 25-1 or 25-2. Furthermore, the row decoders 15A and 15B transfer a plurality of voltages supplied from the driver 28 to the selected block BLK.

The column decoder 20 selects a bit line based on the decoding result of the column address received from the column logic control circuit 24-1 or 24-2. In the data read operation or write operation, the data register 19 temporarily stores read data or write data.

In the data read operation, the sense amplifier 16A senses and amplifies data read from the memory cell transistor to the bit line. The data register 19 temporarily stores the read data read from the memory cell transistors, and transfers the data to the input/output circuit 21. In addition, the data register 19 temporarily stores the write data transferred from the input/output circuit 21 in the data write operation. The sense amplifier 16A transfers the write data stored in the data register 19 to the bit line.

1.2 Operation of Semiconductor Memory Device

The semiconductor memory device 10 includes, in addition to the normally used peripheral circuit 17A or 17B, the redundancy circuit 18A used instead of the peripheral circuit 17A or 17B if there is a failure in the peripheral circuit 17A or 17B. Furthermore, the semiconductor memory device 10 includes, in addition to the peripheral circuit 17C or 17D, the redundancy circuit 18B used instead of the peripheral circuit 17C or 17D if there is a failure in the peripheral circuit 17C or 17D.

In the following, as an operation of the semiconductor memory device 10, switchover from the peripheral circuit 17A or 17B to the redundancy circuit 18A executed in the semiconductor memory device 10 will be described. Note that since switchover from the peripheral circuit 17C or 17D to the redundancy circuit 18B is in the same manner, descriptions thereof will be omitted.

As the peripheral circuit 17A or 17B, the semiconductor memory device 10 includes, for example, the column logic control circuit 24-1, the row logic control circuit 25-1, the high voltage generator 26-1, and the low voltage generator 27-1. Furthermore, as the redundancy circuit 18A of the peripheral circuit 17A or 17B, the semiconductor memory device 10 includes the column logic control circuit 24-2, the row logic control circuit 25-2, the high voltage generator 26-2, and the low voltage generator 27-2.

If all the circuits in the peripheral circuit 17A or 17B operate properly, the circuits in the peripheral circuits 17A and 17B are used. For example, if the column logic control circuit 24-1, the row logic control circuit 25-1, the high voltage generator 26-1, and the low voltage generator 27-1 operate properly, these circuits are used.

On the other hand, if any one of the circuits in the peripheral circuit 17A or 17B does not perform well and cannot be used, the circuit in the redundancy circuit 18A is used instead of the failed circuit. For example, when there is a failure in the column logic control circuit 24-1 and the circuit does not operate properly, the column logic control circuit 24-2 is used instead of the column logic control circuit 24-1. Specifically, a circuit connection to the column logic control circuit 24-1 is interrupted, and a circuit connection to the column logic control circuit 24-2 is executed.

Similarly, when there is a failure in the row logic control circuit 25-1 and the circuit does not operate properly, the row logic control circuit 25-2 is used instead of the row logic control circuit 25-1. Specifically, a circuit connection to the row logic control circuit 25-1 is interrupted, and a circuit connection to the row logic control circuit 25-2 is executed.

For example, when there is a failure in the high voltage generator 26-1 and the generator does not operate properly, the high voltage generator 26-2 is used instead of the high voltage generator 26-1. Specifically, a circuit connection to the high voltage generator 26-1 is interrupted, and a circuit connection to the high voltage generator 26-2 is executed. Thereby, for example, when the high voltage generator 26-1 is in an operating state, the high voltage generator 26-2 is in a non-operating state, and when the high voltage generator 26-2 is in an operating state, the high voltage generator 26-1 is in a non-operating state.

Similarly, when there is a failure in the low voltage generator 27-1 and the generator does not operate properly, the low voltage generator 27-2 is used instead of the low voltage generator 27-1. Specifically, a circuit connection to the low voltage generator 27-1 is interrupted, and a circuit connection to the low voltage generator 27-2 is executed.

A switchover operation from the peripheral circuit 17A or 17B to the redundancy circuit 18A will be described step by step below.

There is usually a storage region in which setting information necessary for operations is stored, in the memory cell array 11A. Herein, for example, the storage region is assumed to be a block (hereinafter, referred to as a ROM block) BLK0. When the semiconductor memory device 10 is powered on, setting information is read from the ROM block BLK0, and various settings are performed in the semiconductor memory device 10 based on this setting information.

If there is a failure in the peripheral circuit 17A or 17B and the circuit does not operate properly, switchover information indicative of switching over the failed peripheral circuit to the redundancy circuit 18A is stored in the ROM block BLK0.

When the semiconductor memory device 10 is powered on, the sequencer 29 reads the switchover information from the ROM block BLK0, and based on this switchover information, switches over the failed peripheral circuit 17A or 17B to the redundancy circuit 18A.

For example, if there is a failure in the high voltage generator 26-1 and the circuit does not operate properly, switchover information indicative of switching over the high voltage generator 26-1 to the high voltage generator 26-2 in the redundancy circuit 18A is stored in the ROM block BLK0.

When the semiconductor memory device 10 is powered on, the sequencer 29 reads the switchover information from the ROM block BLK0. Then, the sequencer 29 switches over the high voltage generator 26-1 to the high voltage generator 26-2 based on this switchover information.

As described above, the switchover from the peripheral circuit 17A or 17B to the redundancy circuit 18A is executed based on the information stored in the storage region (e.g., the ROM block BLK0) in the memory cell array 11A.

1.3 Effects of First Embodiment

According to the first embodiment, the reliability of the operation in the semiconductor memory device can be improved.

The effects of the first embodiment will be described in detail below.

For example, in a semiconductor memory device with a plurality of memory cells and peripheral circuits thereof on the same semiconductor substrate, providing redundancy circuits for the peripheral circuits will increase the area and the cost. It is thus often difficult to provide redundancy circuits. Accordingly, a failure in the peripheral circuits would make the semiconductor memory device defective.

In the first embodiment, a semiconductor memory device includes a memory cell transistor MT provided above a semiconductor substrate, a first voltage generator configured to generate a first voltage to be supplied to the memory cell transistor MT and provided between the semiconductor substrate and the memory cell transistor MT, and a second voltage generator configured to generate the first voltage, provided between the semiconductor substrate and the memory cell transistor MT, and having the same configuration as that of the first voltage generator. Then, if there is a failure in the first voltage generator, the first voltage generator is switched over to the second voltage generator, and the second voltage generator is used.

Thereby, the failed first voltage generator can be rescued by the second voltage generator as the redundancy circuit. As a result, the reliability of the operation in the semiconductor memory device can be improved, and further the yield of the semiconductor memory device can be increased.

In addition, in the first embodiment, the semiconductor memory device further includes a word line WL electrically connected to a gate of the memory cell transistor MT, a bit line BL electrically connected to an end of the memory cell transistor MT, the row logic control circuit 25-1 provided between the semiconductor substrate and the memory cell transistor MT, configured to select a word line WL based on a row address, and configured to control a voltage to be supplied to the selected word line WL, the row logic control circuit 25-2 provided between the semiconductor substrate and the memory cell transistor MT and having a circuit configuration equivalent to that of the row logic control circuit 25-1, the column logic control circuit 24-1 provided between the semiconductor substrate and the memory cell transistor MT, configured to select a bit line BL based on a column address, and configured to control a voltage to be supplied to the selected bit line BL, and the column logic control circuit 24-2 provided between the semiconductor substrate and the memory cell transistor MT and having a circuit configuration equivalent to that of the column logic control circuit 24-1. Then, if there is a failure in the row logic control circuit 25-1, the row logic control circuit 25-1 is switched over to the row logic control circuit 25-2. If there is a failure in the column logic control circuit 24-1, the column logic control circuit 24-1 is switched over to the column logic control circuit 24-2.

Thereby, the failed row logic control circuit 25-1 is rescued by the row logic control circuit 25-2 as the redundancy circuit. The failed column logic control circuit 24-1 is rescued by the column logic control circuit 24-2 as the redundancy circuit. As a result, the reliability of the operation in the semiconductor memory device can be improved, and further the yield of the semiconductor memory device can be increased.

2. Second Embodiment

Next, a semiconductor memory device according to the second embodiment will be described. In the second embodiment, an example is described in which a pattern (e.g., an alignment mark, a dimension accuracy mark) for photolithography and a test pattern for a monitor are provided in a region in which the redundancy circuit is arranged, an end region of the semiconductor memory device 10 or 10A, and a pad region, in the semiconductor memory device 10 shown in FIG. 2 or the semiconductor memory device 10A shown in FIG. 3. In the second embodiment, a description will be given of the semiconductor memory device 10 as an example. Note that in the second embodiment, mainly differences from the first embodiment will be described.

2.1 Configuration of Semiconductor Memory Device

Firstly, a circuit block configuration of the memory array chip 100 in the semiconductor memory device 10 according to the second embodiment will be described with reference to FIG. 9. FIG. 9 is a diagram showing a circuit block configuration of the memory array chip 100 in the semiconductor memory device 10.

The pad region 13A is provided to be adjacent to the memory cell arrays 11B and 11D. A pattern 75 for photolithography and a test pattern 76 for a monitor are provided in the pad region 13A.

The pattern 75 for photolithography includes, for example, an alignment mark used for alignment of a photo mask, and a dimension accuracy mark (or, a dimension measurement mark) for evaluating dimension accuracy of the pattern. The test pattern 76 for a monitor includes, for example, a TEG (test element group). The TEG includes, for example, an element such as a transistor for property evaluation. The other configurations are the same as those described in FIG. 6.

Next, a circuit block configuration of the peripheral circuit chip 200 in the semiconductor memory device 10 according to the second embodiment will be described with reference to FIG. 10. FIG. 10 is a diagram showing a circuit block configuration of the peripheral circuit chip 200 in the semiconductor memory device 10.

The pattern 75 for photolithography and the test pattern 76 for a monitor are provided in the regions in which the redundancy circuits 18A and 18B are provided in the peripheral circuit chip 200 according to the first embodiment shown in FIG. 7.

In a top view shown in FIG. 10, in the left-side area, the pattern 75 for photolithography and the test pattern 76 for a monitor are arranged between the row decoders 15A and 15C arranged in the Y direction, and the row decoders 15B and 15D arranged in the Y direction. Alternatively, the pattern 75 and the test pattern 76 may be arranged between the row decoder 15A and the row decoder 15B, or between the row decoder 15C and the row decoder 15D. Furthermore, the pattern 75 and the test pattern 76 are arranged between the peripheral circuit 17A and the peripheral circuit 17B.

In the top view shown in FIG. 10, in the right-side area, the pattern 75 for photolithography and the test pattern 76 for a monitor are arranged between the row decoders 15E and 15G arranged in the Y direction, and the row decoders 15F and 15H arranged in the Y direction. Alternatively, the pattern 75 and the test pattern 76 may be arranged between the row decoder 15E and the row decoder 15F, or between the row decoder 15G and the row decoder 15H. Furthermore, the pattern 75 and the test pattern 76 are arranged between the peripheral circuit 17C and the peripheral circuit 17D.

In addition, in the top view shown in FIG. 10, in end regions adjacent to the sense amplifiers 16A and 16C, the pattern 75 for photolithography and the test pattern 76 for a monitor are provided. The pattern 75 and the test pattern 76 are each arranged between the row decoder 15A and the row decoder 15B, and between the row decoder 15E and the row decoder 15F.

Next, details of an alignment mark as the pattern 75 for photolithography and a TEG as the test pattern 76 for a monitor will be described with reference to FIGS. 11 and 12.

FIG. 11 is a plan view showing an example of alignment marks provided in the peripheral circuit chip 200 in the semiconductor memory device 10. As shown in FIG. 11, a pattern 75A is arranged at a portion corresponding to each side of a rectangle, and patterns 75B are arranged outside the patterns 75A with a predetermined space therebetween. After forming the patterns 75A by a first photo mask, when forming the patterns 75B by a second photo mask, the patterns 75B are aligned to make the spaces between the patterns 75A and the patterns 75B equal.

FIG. 12 is a cross-sectional view taken along a line B-B in FIG. 10 and showing an example of a TEG provided in the peripheral circuit chip 200.

As shown in FIG. 12, a source region 80A, a drain region 80A, and element isolation regions 80B are provided in a semiconductor substrate 50. A gate insulating layer 81 is provided on the semiconductor substrate 50 between the source region 80A and the drain region 80A in the positive direction of the Z direction, and a gate electrode 82 is provided on the gate insulating layer 81. An nMOS transistor or pMOS transistor TR constituting the TEG includes the source region 80A, the drain region 80A, a semiconductor layer of the semiconductor substrate 50, the gate insulating layer 81, and the gate electrode 82.

Vias 83 are provided on the source region 80A and the drain region 80A, respectively, in the positive direction of the Z direction, and conductive layers 84 are provided on the vias 83, respectively. A via 85 and a conductive pad 86 are provided in this order in the positive direction of the Z direction on each of the conductive layers 84. An insulating layer 87 is provided on the conductive pad 86 in the positive direction of the Z direction. Conductive layers 88 and 89 are provided in this order in the positive direction of the Z direction on the insulating layer 87 through insulating layers. The conductive pad 86 is covered by the insulating layer 87, and is not electrically connected to an upper-layer interconnect (e.g., the conductive layer 88) or an external terminal.

2.2 Effects of Second Embodiment

According to the second embodiment, the reliability of the operation in the semiconductor memory device can be improved in the same manner as the above-described first embodiment.

The effects of the second embodiment will be described in detail below.

FIG. 13 is a plan view showing chips arranged in one reticulum of a wafer in a manufacturing process of a semiconductor memory device as a comparative example. For example, as shown in FIG. 13, a plurality of semiconductor memory devices (hereinafter, referred to as chips) 10 are arranged in a region of a reticulum 201 used in an exposure apparatus. Dicing lines 202 for cutting the chips individually are provided between the chips. On the dicing lines 202, the patterns (e.g., alignment marks and dimension accuracy marks) for photolithography and the test patterns for a monitor are arranged.

A width of the dicing lines 202 can be made small technologically, but there is a limit to the reduction of the dicing lines 202 since areas for arranging the patterns for photolithography and the test patterns for a monitor are required. In addition, since areas on the dicing lines 202 are limited, there is a restriction on the patterns for photolithography and the test patterns that can be arranged therein. Thus, a pattern for photolithography and a test pattern for a monitor that are high-performance or can obtain a large amount of information often cannot be arranged.

Accordingly, in the second embodiment, by arranging the patterns 75 for photolithography and the test patterns 76 for a monitor within chip regions inside the dicing lines 202, the regions on the dicing lines 202 required for arranging the patterns 75 for photolithography and the test patterns 76 for a monitor can be reduced and the width of the dicing lines 202 can be reduced.

Furthermore, since the width of the dicing lines 202 can be reduced, the number of chips per wafer can be increased, and the cost of a product (i.e., the semiconductor memory device) can be reduced.

In addition, by using the chip regions inside the dicing lines 202 as the regions for arranging the patterns 75 for photolithography and the test patterns 76 for a monitor, it is possible to arrange a pattern for photolithography and a test pattern for a monitor that are high-performance or can obtain a large amount of information and thus cannot be arranged on the dicing lines 202.

As described above, the reliability of the operation in the semiconductor memory device can be improved according to the second embodiment. Furthermore, the number of chips (semiconductor memory devices) per wafer can be increased, and the cost of the semiconductor memory devices can be reduced.

In the second embodiment, the semiconductor memory device 10 in which the memory array chip 100 and the peripheral circuit chip 200 are bonded together as shown in FIG. 2 is described as an example, but the configuration is not limited thereto. This suggestion is applicable to the semiconductor memory device 10A as shown in FIG. 3 in which the region 300 in which peripheral circuitry is formed and the region 400 in which memory cells are formed on the region 300 are provided on one semiconductor substrate 30.

3. Other Modifications, etc

In the above-described embodiments, the semiconductor memory device 10 in which the memory array chip 100 and the peripheral circuit chip 200 are bonded together, and the semiconductor memory device 10A in which the region 300 in which peripheral circuitry is formed and the region 400 in which memory cells are formed on the region 300 are stacked on one semiconductor substrate 30, are described as examples, but the configuration is not limited thereto. This suggestion is applicable to semiconductor memory devices having other structures.

The foregoing embodiments have assumed examples where the semiconductor memory device is a NAND flash memory. The embodiments are not limited to NAND flash memories, but may be applicable to any type of semiconductor memory as well as various storage devices other than semiconductor memories.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a memory cell array above a substrate;
a first circuit on a portion of the substrate beneath the memory cell array; and
a pattern for photolithography provided on a central side of the substrate compared to the first circuit,
wherein the memory cell array includes a plurality of first conductive layers stacked in a first direction above the substrate, and a pillar penetrating through the first conductive layers in the first direction.

2. The semiconductor memory device according to claim 1, wherein
the pattern is an alignment mark.

3. The semiconductor memory device according to claim 2, wherein
the alignment mark includes first patterns, and second patterns arranged outside the first patterns with predetermined spaces therebetween.

4. The semiconductor memory device according to claim 3, wherein
the predetermined spaces are equal to one another.

5. The semiconductor memory device according to claim 1, wherein
the pattern is a dimension measurement mark.

6. The semiconductor memory device according to claim 1, wherein
the pattern includes first patterns, and second patterns arranged outside the first patterns with predetermined spaces therebetween.

7. The semiconductor memory device according to claim 1, wherein
the pattern includes first patterns arranged at portions corresponding to sides of a rectangle, and second patterns arranged outside the first patterns with predetermined spaces therebetween.

8. The semiconductor memory device according to claim 1, further comprising:
a first chip including the memory cell array; and
a second chip including the first circuit and the pattern.

9. The semiconductor memory device according to claim 8, wherein
the pattern is provided between the substrate and the memory cell array.

10. The semiconductor memory device according to claim 1, further comprising:
a first chip including the memory cell array, the first circuit and the pattern.

11. The semiconductor memory device according to claim 1, further comprising:
a plurality of memory cell arrays including the memory cell array; and
a plurality of row decoders on the substrate and connected to the plurality of memory cell arrays, wherein

22 the pattern is provided between the plurality of row decoders.

12. The semiconductor memory device according to claim 1, further comprising:
a plurality of memory cell arrays including the memory cell array; and
a plurality of sense amplifiers on the substrate and connected to the plurality of memory cell arrays, wherein
the pattern is provided between the plurality of sense amplifiers.

13. A semiconductor memory device comprising:
a memory cell array; and
a pad region provided adjacent to the memory cell array, and including a plurality of first pads and a pattern for photolithography, wherein
the plurality of first pads are for connecting a memory controller provided outside of the semiconductor memory device, and
the pattern includes first patterns arranged at portions corresponding to sides of a rectangle, and second patterns arranged outside of the first patterns with predetermined spaces therebetween.

*  *  *  *  *